(12) United States Patent
Rice et al.

(10) Patent No.: US 9,905,447 B2
(45) Date of Patent: Feb. 27, 2018

(54) SEALED SUBSTRATE CARRIERS AND SYSTEMS AND METHODS FOR TRANSPORTING SUBSTRATES

(71) Applicant: Applied Materials, Inc., Santa Clara, CA (US)

(72) Inventors: Michael Robert Rice, Pleasanton, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 536 days.

(21) Appl. No.: 14/503,859

(22) Filed: Oct. 1, 2014

(65) Prior Publication Data
US 2015/0016941 A1 Jan. 15, 2015

Related U.S. Application Data

(62) Division of application No. 12/257,376, filed on Oct. 23, 2008, now Pat. No. 8,870,512.

(60) Provisional application No. 60/983,186, filed on Oct. 27, 2007.

(51) Int. Cl.
*H01L 21/677* (2006.01)
*H01L 21/673* (2006.01)
*B65D 85/00* (2006.01)

(52) U.S. Cl.
CPC ........ *H01L 21/67763* (2013.01); *B65D 85/70* (2013.01); *H01L 21/67386* (2013.01); *H01L 21/67393* (2013.01); *H01L 21/67775* (2013.01); *Y10S 414/137* (2013.01)

(58) Field of Classification Search
CPC ................... H01L 21/67376; H01L 21/67393
See application file for complete search history.

(56) References Cited

U.S. PATENT DOCUMENTS

| | | | |
|---|---|---|---|
| 5,364,219 A | 11/1994 | Takahashi et al. | |
| 5,664,925 A | 9/1997 | Muka et al. | |
| 5,988,233 A | 11/1999 | Fosnight et al. | |
| 5,997,235 A | 12/1999 | Hofmeister | |
| 6,199,604 B1 * | 3/2001 | Miyajima | H01L 21/67017 141/348 |
| 6,368,411 B2 | 4/2002 | Roberson et al. | |
| 6,430,802 B1 * | 8/2002 | Miyajima | H01L 21/67373 206/711 |

(Continued)

OTHER PUBLICATIONS

International Search Report and Written Opinion of International Application No. PCT/US08/81015 dated Dec. 16, 2008.

(Continued)

*Primary Examiner* — Jonathan Snelting
(74) *Attorney, Agent, or Firm* — Dugan & Dugan, PC

(57) ABSTRACT

An electronic device manufacturing system is disclosed. The system includes a processing tool having one or more processing chambers each adapted to perform an electronic device manufacturing process on one or more substrates; a substrate carrier adapted to couple to the system and carry one or more substrates; and a component adapted to create a sealed environment relative to at least a portion of the substrate carrier and to substantially equalize the sealed environment with an environment within the substrate carrier. Methods of the invention are described as are numerous other aspects.

11 Claims, 4 Drawing Sheets

(56) References Cited

U.S. PATENT DOCUMENTS

| | | | |
|---|---|---|---|
| 6,641,349 B1* | 11/2003 | Miyajima | H01L 21/67126 206/711 |
| 6,899,145 B2 | 5/2005 | Aggarwal | |
| 7,077,173 B2 | 7/2006 | Tokunaga | |
| 7,360,981 B2 | 4/2008 | Weaver | |
| 2002/0197145 A1 | 12/2002 | Yamamoto et al. | |
| 2003/0021657 A1 | 1/2003 | Yamagishi | |
| 2003/0031537 A1 | 2/2003 | Tokunaga | |
| 2003/0077150 A1 | 4/2003 | Matsuda et al. | |
| 2005/0077204 A1* | 4/2005 | Sumi | F16K 15/026 206/710 |
| 2005/0105997 A1 | 5/2005 | Englhardt et al. | |
| 2005/0111935 A1 | 5/2005 | Kim et al. | |
| 2005/0169730 A1 | 8/2005 | Aggarwal et al. | |
| 2006/0061979 A1 | 3/2006 | Elliott et al. | |
| 2007/0057322 A1 | 3/2007 | Elliott | |
| 2007/0059145 A1 | 3/2007 | Rice et al. | |
| 2007/0140822 A1 | 6/2007 | Elliott et al. | |
| 2007/0141280 A1 | 6/2007 | Rice | |
| 2007/0158183 A1 | 7/2007 | Shah et al. | |
| 2009/0110518 A1 | 4/2009 | Rice et al. | |

OTHER PUBLICATIONS

International Preliminary Report on Patentability and Written Opinion of International Application No. PCT/US2008/081015 dated May 6, 2010.
Restriction Requirement of U.S. Appl. No. 12/257,376 dated Jun. 14, 2011.
Jul. 8, 2011 Response to Restriction Requirement of U.S. Appl. No. 12/257,376 dated Jun. 14, 2011.
Office Action of U.S. Appl. No. 12/257,376 dated Jul. 21, 2011.
Oct. 14, 2011 Response to Office Action of U.S. Appl. No. 12/257,376 dated Jul. 21, 2011.
Final Office Action of U.S. Appl. No. 12/257,376 dated Nov. 10, 2011.
Interview Summary of U.S. Appl. No. 12/257,376, filed Jan. 10, 2012.
Amendment Submitted with RCE of U.S. Appl. No. 12/257,376, filed Jan. 10, 2012.
Examiner Interview Summary of U.S. Appl. No. 12/257,376 dated Jan. 19, 2012.
Office Action of U.S. Appl. No. 12/257,376 dated May 22, 2012.
Aug. 21, 2012 Response to Office Action of U.S. Appl. No. 12/257,376.
Examiner Interview Summary of U.S. Appl. No. 12/257,376 dated Aug. 21, 2012.
Final Office Action of U.S. Appl. No. 12/257,376 dated Oct. 12, 2012.
Advisory Action of U.S. Appl. No. 12/257,376 dated Dec. 21, 2012.
Dec. 3, 2012 Reply to Oct. 12, 2012 Final Office Action of U.S. Appl. No. 12/257,376.
Office Action of U.S. Appl. No. 12/257,376 dated Apr. 10, 2013.
Jun. 13, 2013 Reply to Apr. 10, 2013 Office Action of U.S. Appl. No. 12/257,376.
Final Office Action of U.S. Appl. No. 12/257,376 dated Sep. 9, 2013.
Nov. 5, 2013 Reply to Sep. 9, 2013 Final Office Action of U.S. Appl. No. 12/257,376.
Advisory Action of U.S. Appl. No. 12/257,376 dated Nov. 29, 2013.
Office Action of U.S. Appl. No. 12/257,376 dated Feb. 4, 2014.
Apr. 30, 2014 Reply and Interview Summary to Feb. 4, 2014 Office Action of U.S. Appl. No. 12/257,376.
Examiner Interview Summary of U.S. Appl. No. 12/257,376 dated May 2, 2014.
Notice of Allowance of U.S. Appl. No. 12/257,376 dated Jun. 25, 2014.
Supplemental Notice of Allowability of U.S. Appl. No. 12/257,376 dated Sep. 8, 2014.
Interview Summary of U.S. Appl. No. 12/257,376, filed Aug. 16, 2012.

* cited by examiner

SEALED SUBSTRATE CARRIERS AND SYSTEMS AND METHODS FOR TRANSPORTING SUBSTRATES

RELATED APPLICATIONS

This is a divisional of, and claims priority to, U.S. patent application Ser. No. 12/257,376, filed Oct. 23, 2008 and entitled "SEALED SUBSTRATE CARRIERS AND SYSTEMS AND METHODS FOR TRANSPORTING SUBSTRATES", which claims priority to U.S. Provisional Patent Application No. 60/983,186, filed Oct. 27, 2007 and entitled "SEALED SUBSTRATE CARRIERS AND METHODS OF USING SAME", both of which are hereby incorporated by reference herein for all purposes.

FIELD

The present invention relates to electronic device manufacturing and more particularly to sealed substrate carriers and methods of using the same.

BACKGROUND

Manufacturing of electronic devices typically involves performing a sequence of procedures with respect to a substrate such as a silicon substrate, a glass plate, a polymer substrate, etc. (Such substrates may also be referred to as wafers, whether patterned or unpatterned.) These steps may include polishing, deposition, etching, photolithography, heat treatment, and so forth. Usually a number of different processing steps may be performed in a single processing system or "tool" which includes a plurality of processing chambers. However, it is generally the case that other processes may be required to be performed at other processing locations within a fabrication facility, and it is accordingly necessary that substrates be transported within the fabrication facility from one processing location to another. Depending upon the type of electronic device to be manufactured, there may be a relatively large number of processing steps required to be performed at many different processing locations within the fabrication facility.

It is conventional to transport substrates from one processing location to another within substrate carriers such as pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

SUMMARY

In a first aspect, an electronic device manufacturing system is provided. The system includes a processing tool having one or more processing chambers each adapted to perform an electronic device manufacturing process on one or more substrates; a substrate carrier having a sealed environment, the substrate carrier adapted to couple to the system and carry one or more substrates; and a component adapted to dock with the substrate carrier, the component adapted to create a sealed environment relative to at least a portion of the substrate carrier and to substantially equalize the sealed environment at the component with the sealed environment within the substrate carrier.

In another aspect, an electronic device manufacturing system is provided. The electronic device manufacturing system includes a processing tool having a load lock chamber and one or more processing chambers each adapted to perform an electronic device manufacturing process on a substrate; a factory interface coupled to the processing tool; and a load port coupled to the factory interface wherein the load port is adapted to support a substrate carrier containing one or more substrates and the factory interface is adapted to transfer substrates from the substrate carrier to the load lock chamber of the processing tool wherein the load port is further adapted to create a sealed environment relative to at least a portion of the substrate carrier and to substantially equalize the sealed environment with an environment within the substrate carrier.

In yet another aspect, an electronic device manufacturing system is provided. The electronic device manufacturing system includes a processing tool having a load lock chamber and one or more processing chambers each adapted to perform an electronic device manufacturing process on a substrate; a factory interface coupled to the processing tool; and a load port coupled to the factory interface wherein the load port is adapted to support a substrate carrier containing one or more substrates and to transfer the substrate carrier to the load lock chamber of the processing tool through the factory interface wherein the load lock chamber is further adapted to create a sealed environment relative to at least a portion of the substrate carrier and to substantially equalize the sealed environment with an environment within the substrate carrier.

In another aspect, a method of transporting substrates within an electronic device manufacturing system is provided. The method includes providing a sealed environment in a substrate carrier; creating a sealed environment around at least a portion of the substrate carrier at a component of the electronic device manufacturing system; and substantially equalizing the sealed environment at the component with the sealed environment of the substrate carrier.

In another aspect, a method of transporting substrates within an electronic device manufacturing system is provided. The method includes providing a substrate carrier having a door and a sealed environment; docking the substrate carrier to a component of the electronic device manufacturing system; providing a sealed environment around at least a portion of the substrate carrier at the component; and substantially equalizing the sealed environments between the component and the substrate carrier before opening the door.

In another aspect, a substrate carrier adapted to couple to an electronic device processing system component and carry one or more substrates is provided. The substrate carrier includes a main body; a carrier door coupled to the main body thereby forming an internal cavity adapted to receive the one or more substrates; a resilient sealing member on at least one of the carrier door and main body forming the seal between the main body and the carrier door; one or more ports coupled to the internal cavity for evacuating and/or adapted to allow filling the substrate carrier with one of a an inert gas and a non-reactive gas; and a sealing surface provided on the main body and adapted to seal against a corresponding surface feature of the electronic device processing system component.

Numerous other aspects are provided in accordance with these and other aspects of the invention. Other features and aspects of the present invention will become more fully apparent from the following detailed description, the appended claims, and the accompanying drawings.

DESCRIPTION

Figure 1:
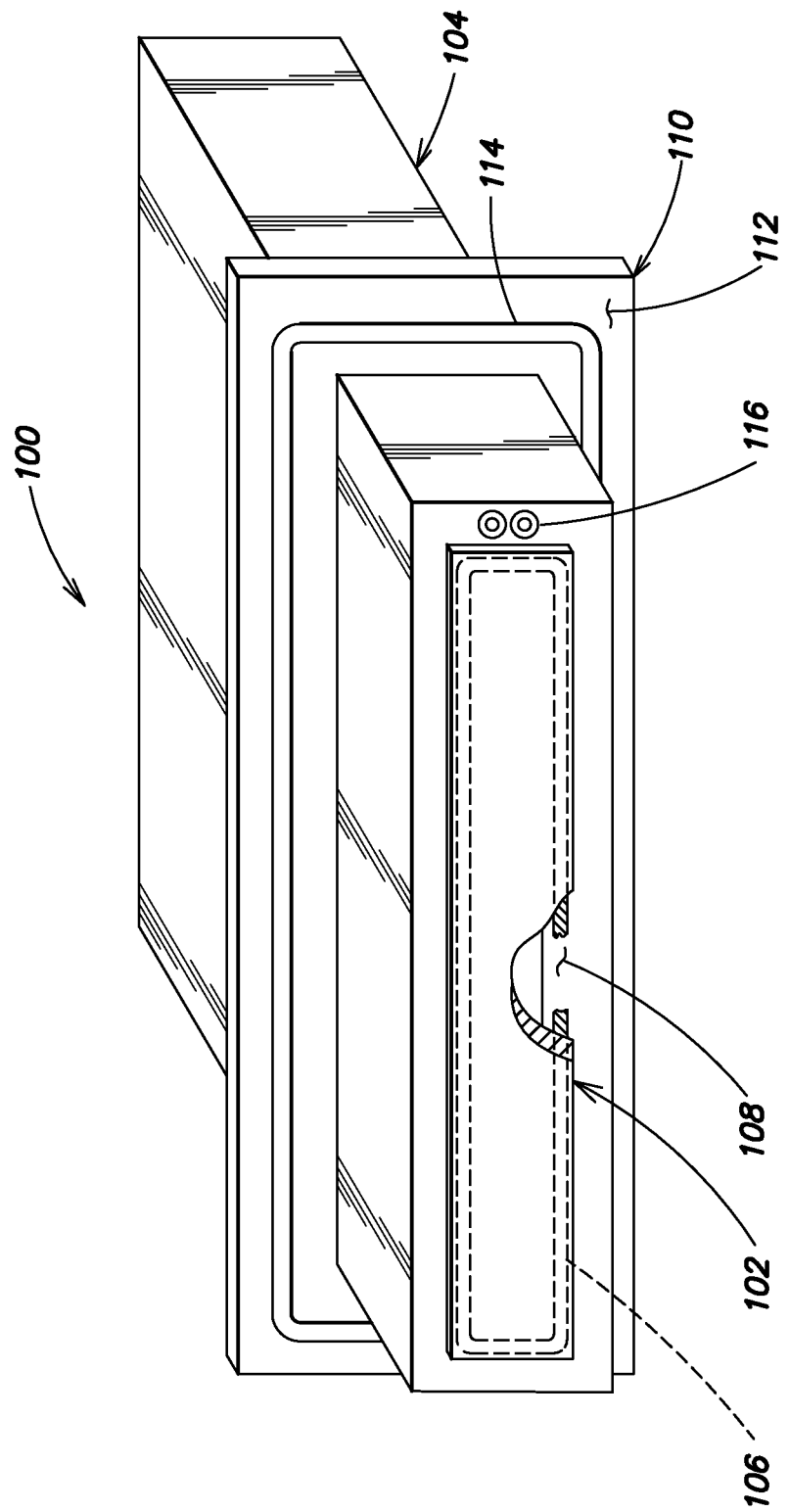
FIG. 1 is a perspective view of a sealed carrier apparatus of the present invention.

Embodiments of the present invention provide sealed substrate carriers and methods for using such sealed substrate carriers. For example, the sealed substrate carriers may be hermetically and/or vacuum sealed to reduce and/or prevent exposure of substrates stored within the substrate carriers to particulates or other contaminants, oxidants, other reactive species and/or the like. In some embodiments, a substrate carrier may be evacuated to a suitable vacuum level and/or filled with a suitable inert or otherwise nonreactive gas such nitrogen, argon, etc. prior to transport of the substrate carrier. In this manner, substrates stored within the substrate carrier may be transported without being exposed to particulates, contaminants, oxidants or other undesirable substances during transport and/or prior to or after processing.

In some embodiments, various apparatus may be provided for opening, closing, pumping, purging, loading and/or unloading such sealed substrate carriers. For example, a system component, such as a load port of a processing tool (e.g., of a factory interface) may be adapted to create a sealed environment around all or a portion of a sealed substrate carrier (such as a door of the sealed substrate carrier). The sealed environment at the component then may be substantially "equalized" with the environment in the sealed substrate carrier. For instance, in embodiments in which the substrate carrier is evacuated to a predetermined vacuum level after loading with substrates, the sealed environment at the component may be considered substantially equalized if evacuated to a substantially similar vacuum level before a door of the substrate carrier is opened. This may be accomplished by one or more pump-purge cycles. By substantially similar, it is meant that the vacuum level is substantially the same, but may vary from each other by about 10% or less.

Likewise, in embodiments in which the substrate carrier may contain an inert gas, the sealed environment at the component may be considered substantially equalized when the substrate carrier and the component are filled with a substantially similar gas, i.e., gases of the same type. The inert gases and/or nonreactive gases may also be provided at substantially the same temperature and pressure in the component and the substrate carrier before a door of the substrate carrier is opened. However, a temperature of the gases may be up to about 20% different, and the absolute pressure of the substrate carrier gas and the component gas may be as much as about 10% different.

In the case of an inert gas and non-reactive gas mixtures, the molar percent of each gas in the mixtures should be substantially the same. However, the molar percentages of the gases may be up to about 5% different.

In other embodiments, the system component may be a load lock chamber of a processing tool. The load lock chamber may be adapted to create a sealed environment around all or a portion of a sealed substrate carrier (such as a door of the sealed substrate carrier). The sealed environment at the load lock chamber then may be equalized with the environment in the sealed substrate carrier. For instance, in embodiments in which the substrate carrier is evacuated to a predetermined vacuum level after loading, the sealed environment at the load lock chamber may be evacuated to a similar vacuum level before a door of the substrate carrier is opened. Likewise, in embodiments in which the substrate carrier may contain an inert gas, the sealed environment at the load lock chamber may be filled with a similar inert gas (e.g., via one or more pump-purge cycle(s)) before a door of the substrate carrier is opened.

The present invention may be employed with both large lot and small lot size substrate carriers. As used herein, the term "small lot size" substrate carrier or "small lot" carrier may refer to a carrier that is adapted to hold fewer substrates than a conventional "large lot size" carrier which typically holds thirteen or twenty-five substrates. As an example, a small lot size carrier may be adapted to hold a maximum of twelve or fewer substrates. In other examples, a small lot size carrier may be adapted to hold a maximum of five or less substrates. In some embodiments, other small lot size carriers may be employed (e.g., small lot size carriers that hold a maximum of one, two, three, four or more than five substrates, but less than that of a large lot size carrier). In general, each small lot size carrier may hold too few substrates for human transport of carriers to be commercially viable within an electronic device or other manufacturing facility. Consequently, mechanized/automated transport of small lot size carriers is typically employed.

Further details of exemplary embodiments of the present invention are described with reference to FIGS. 1-4 herein.

FIG. 1 is a perspective view of a first exemplary sealable substrate carrier 100 provided in accordance with the present invention. With reference to FIG. 1, the carrier 100 may include a carrier door 102 coupled to a main body 104 thereby forming an internal cavity adapted to receive one or more substrates (wafers, glass plates, etc.). The carrier door 102 may be selectively removed (opened) to allow access to a cavity inside region of the main body 104 where one or more substrates may be stored. Additionally, the carrier door 102 may be selectively attached to the main body 104 so as to hermetically seal and/or vacuum seal the door 102 against the main body 104. For instance, the carrier door 102 and/or main body 104 may include a resilient sealing member 106, such as an o-ring, that may compress and seal the carrier door 102 against a sealing surface 108 of the main body 104. Other configurations for sealing the carrier door 102 relative to the main body 104 may be employed.

The main body 104 may be sized to store one or more substrates therein. In some embodiments, substrate support features such as recessed shelves or slots may be employed to securely hold each substrate within the main body 104. Other supporting, clamping, retaining or similar features may be employed to secure each substrate within the main body 104.

Figure 2:
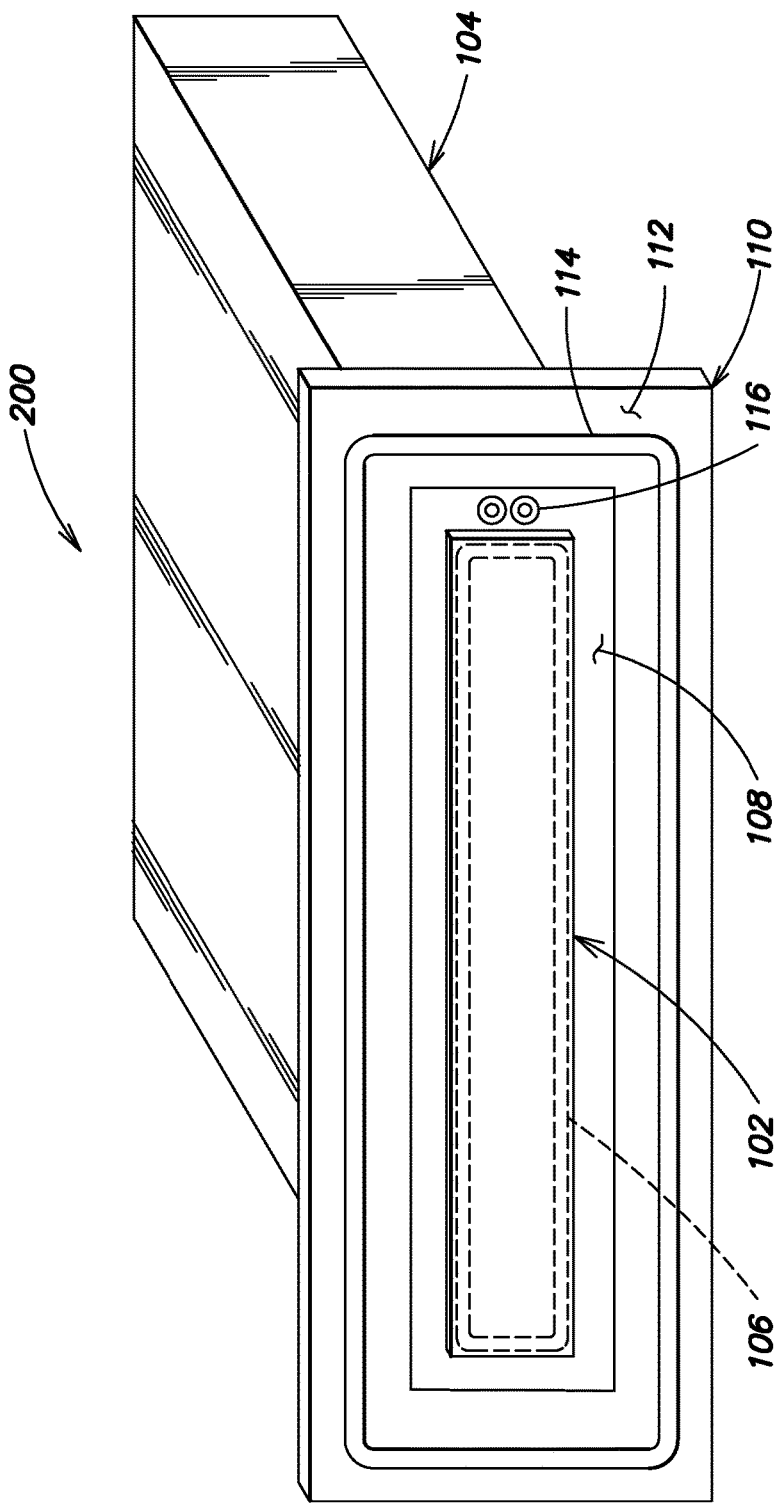
FIG. 2 is a perspective view of another embodiment of a sealed carrier apparatus of the present invention.

As shown in FIG. 1, the main body 104 may include an outer flange 110 which may extend outward from the main body 104 in a radial direction. The outer flange 110 may provide a sealing surface 112 for a corresponding surface feature of a system component to which the carrier 100 interfaces, such as a load port, load lock chamber or other location (as described below). In some embodiments, the sealing surface 112 may include a resilient sealing member 114 such as an o-ring or a seal integrally bonded to the surface 112 for creating a substantially airtight and/or vacuum seal, while in other embodiments the corresponding surface feature of a component to which the substrate carrier 100 may dock, such as a load port, load lock chamber or other location, may include a resilient sealing member as described above. In some embodiments, both surfaces may include a sealing member. While the outer flange 110 is shown in FIG. 1 as being located other than at an end (e.g., in a middle region) of the main body 104, it will be understood that the outer flange 110 may be located anywhere along a length of the main body 104. For example, FIG. 2 is a perspective view of a second exemplary sealable substrate carrier 200 provided in accordance with the present invention in which the outer flange 110 is positioned at or near a front of the carrier 200 (e.g., near the carrier door 102).

In yet other embodiments, the outer flange 110 may be entirely eliminated, and a surface feature of a system component to which the substrate carrier may dock with (e.g., a load port, load lock chamber or other location) may seal directly against a surface of the carrier 100 or 200, such as along a frontal sealing surface 108 of the main body 104 or at any other location along the main body 104 such as around a peripheral surface thereof.

Each substrate carrier 100, 200 may include one or more ports 116 for evacuating and/or filling the carrier with a gas such as an inert or non-reactive gas. The ports may be valves, such as poppet valves, gate valves, or ball valves, which may be selectively closed after evacuating and/or filling the substrate carrier 100, 200.

Figure 3:
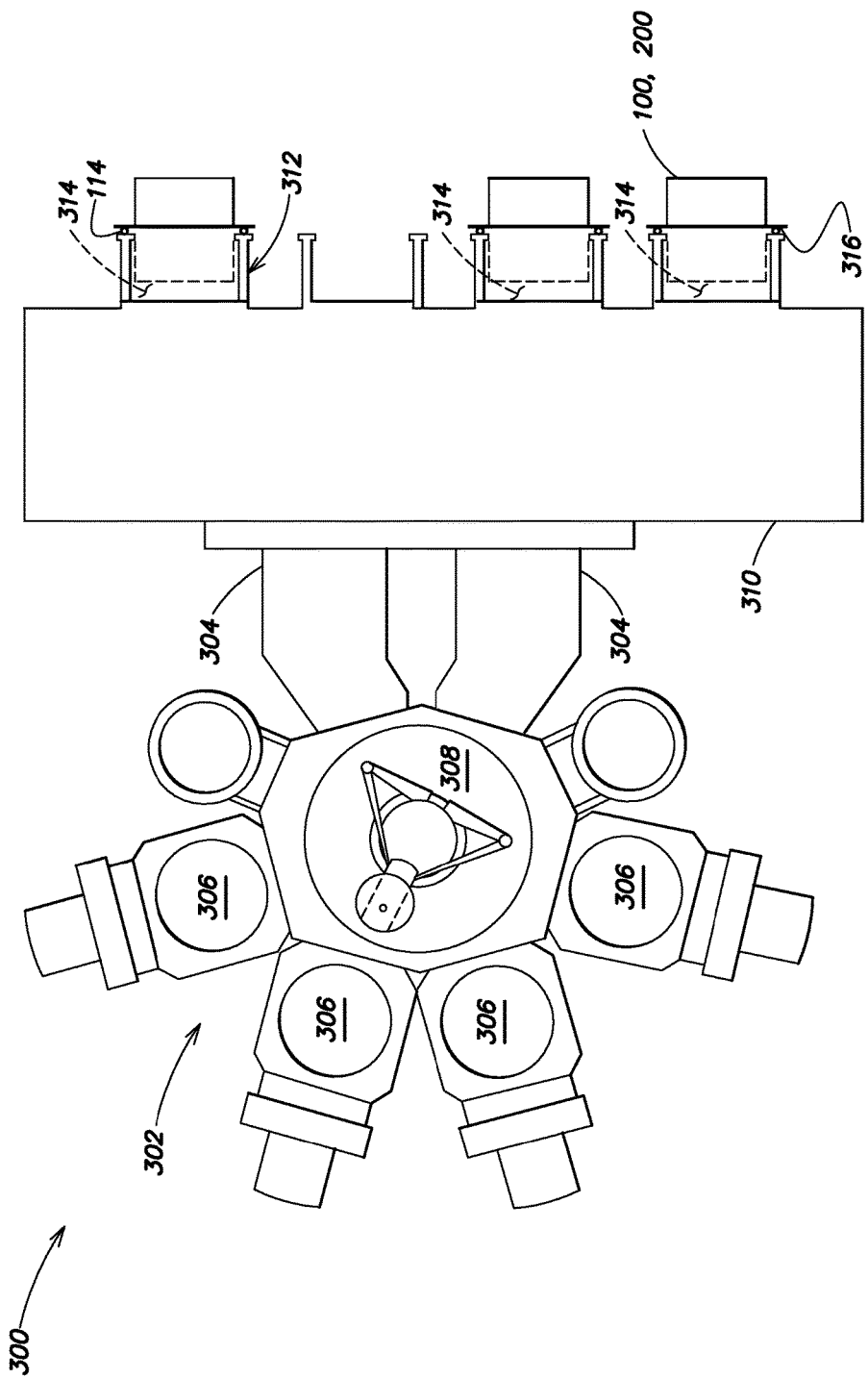
FIG. 3 is a top plan view of an embodiment of a system interfacing with the sealed carrier apparatus of the present invention at a factory interface.

FIG. 3 is a top plan view of a first exemplary embodiment of an electronic device manufacturing system 300 provided in accordance with the present invention. The system 300 may include a processing tool 302 having a system component such as a load lock chamber 304 coupled to one or more processing chambers 306 by a central transfer chamber 308. Each processing chamber 306 may be adapted to perform an electronic device manufacturing process on a substrate.

The system 300 may also includes a factory interface 310 coupled to the processing tool 302 and one or more load ports 312 coupled to the factory interface 310. Each load port 312 may be adapted to support a substrate carrier 100, 200, or another suitable substrate carrier, containing one or more substrates. The factory interface 310 may be adapted to transfer substrates from a substrate carrier 100, 200 to a load lock chamber 304 of the processing tool 302 via a conventional substrate handler or other robot (not shown).

In some embodiments, each component (e.g., load port 312) may be adapted to create a sealed environment 314 relative to at least a portion of a substrate carrier 100, 200 and to equalize the sealed environment 314 with an environment within the substrate carrier. For example, flange 110 of a substrate carrier 100, 200 may provide the sealing surface 112 against which a corresponding surface feature 316 of the load port 312 may seal. In some embodiments, the sealing surface 112 of a carrier 100, 200 may include a resilient sealing member 114, while in other embodiments the surface feature 316 of a load port 312 may include a resilient sealing member (sealing member not explicitly shown).

In embodiments in which a substrate carrier 100, 200 is evacuated to a predetermined vacuum level after loading of the substrates, the sealed environment 314 at a load port 312 may be substantially equalized by being evacuated to a similar vacuum level before a door of the substrate carrier is opened. Likewise, in embodiments in which a substrate carrier 100, 200 contains an inert gas, the sealed environment 314 at a load port 312 may be substantially equalized by being filled with a similar inert gas (e.g., via one or more pump-purge cycle(s)) before a carrier door 102 (FIG. 1, 2) of the substrate carrier 100, 200 is opened. Optionally, in some embodiments, it may be desirable to equalize the environment by changing a vacuum level in the carrier 100, 200 to be substantially equal to a vacuum level that may exist at the sealed environment 314.

Figure 4:
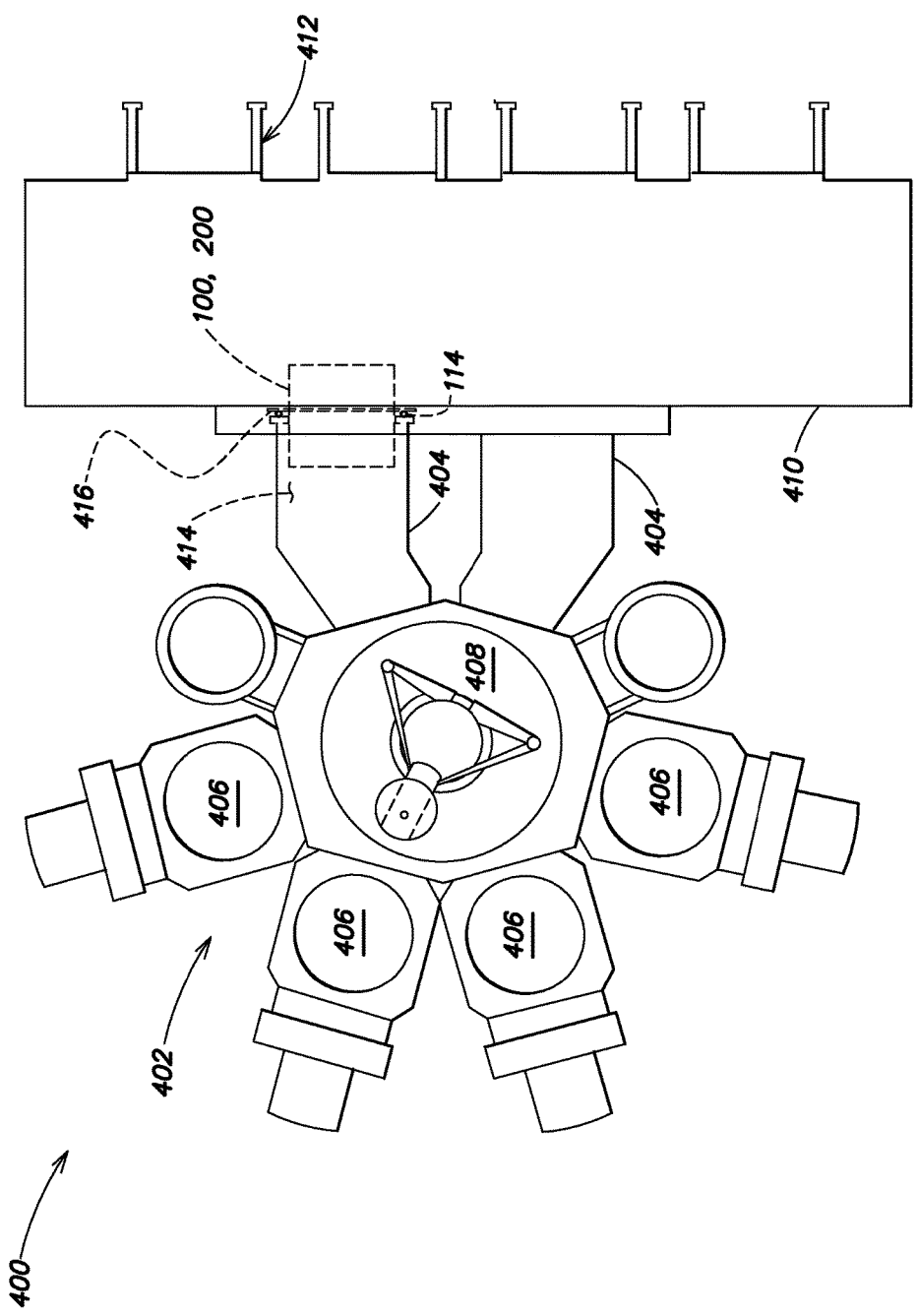
FIG. 4 is a top plan view of an embodiment of a system interfacing with the sealed carrier apparatus of the present invention at a load lock chamber.

FIG. 4 is a top plan view of a second exemplary embodiment of an electronic device manufacturing system 400 provided in accordance with the present invention. The system 400 may include a processing tool 402 having a one or more load lock chambers 404 coupled to one or more processing chambers 406 by a central transfer chamber 408. Each processing chamber 406 may be adapted to perform an electronic device manufacturing process on a substrate.

The system 400 may also include a factory interface 410 coupled to the processing tool 402 and one or more load ports 412 coupled to the factory interface 410. Each load port 412 is adapted to support a substrate carrier 100, 200, or another suitable substrate carrier, containing one or more substrates. Each load port 412 and/or the factory interface 410 may be configured and adapted to transfer a substrate carrier 100, 200 to a system component such as a load lock chamber 404 of the processing tool 402 via a docking mechanism, substrate carrier handler or other mechanism (not shown).

In some embodiments, each component such as a load lock chamber 404 is adapted to create a sealed environment 414 relative to at least a portion of a substrate carrier 100, 200 and to substantially equalize the sealed environment 414 with an environment within the substrate carrier 100, 200. For example, flange 110 of a substrate carrier 100, 200 may provide the sealing surface 112 against which a corresponding surface feature 416 of the load lock chamber 404 may seal. In some embodiments, the sealing surface 112 of a carrier 100, 200 may include a resilient sealing member 114, while in other embodiments the surface feature 416 of a load lock chamber 404 may include a resilient sealing member.

In embodiments in which an environment of a substrate carrier 100, 200 is evacuated to a predetermined vacuum level after loading, the sealed environment 414 at a load lock chamber 404 may be evacuated to a substantially similar vacuum level before a door of the substrate carrier is opened. Optionally, the vacuum level of the carrier may be changed to be substantially equal to a vacuum level of the sealed environment. Likewise, in embodiments in which a substrate carrier 100, 200 contains an inert gas, the sealed environment 414 at a load lock chamber 404 may be filled with a substantially similar inert gas (e.g., via one or more pump-purge cycle(s)) before a door of the substrate carrier is opened.

The foregoing description discloses only exemplary embodiments of the invention. Modifications of the above disclosed apparatus and methods which fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

The invention claimed is:

1. A substrate carrier adapted to couple to a system component and carry one or more substrates, comprising:

a main body;

a carrier door coupled to the main body thereby forming an internal cavity adapted to receive the one or more substrates;

a resilient sealing member on at least one of the carrier door and main body forming a seal between the main body and the carrier door;

one or more ports coupled to the internal cavity adapted to evacuate the internal cavity and/or fill the internal cavity with an inert gas or a non-reactive gas;

a sealing surface provided on the main body and adapted to seal against a corresponding surface feature of the system component thereby forming a sealed environment between the carrier door and the system component; and one or more environmental conditions in the sealed environment between the carrier door and the system component configured to be substantially equal to one or more environmental conditions within the internal cavity.

2. The substrate carrier of claim 1 wherein the main body comprises a flange extending outwardly from the main body, the flange having the sealing surface thereon.

3. The substrate carrier of claim 2 wherein the flange is set back rearwardly from the carrier door.

4. The substrate carrier of claim 2 wherein the flange and the carrier door are positioned at a front of the main body.

5. The substrate carrier of claim 2 wherein the flange is configured to couple to a load lock chamber of a processing tool or to a load port of a factory interface.

6. The substrate carrier of claim 1 wherein at least one of the one or more ports comprises a poppet valve, a gate valve, or a ball valve.

7. The substrate carrier of claim 1, wherein the one or more environmental conditions includes a pressure of a gas.

8. The substrate carrier of claim 1, wherein the one or more environmental conditions includes a temperature of a gas.

9. The substrate carrier of claim 1, wherein the one or more environmental conditions includes gas content.

10. The substrate carrier of claim 1, wherein the carrier door is adapted to be opened after the one or more environmental conditions within the sealed environment are substantially equal to the one or more environmental conditions within the internal cavity.

11. The substrate carrier of claim 1, wherein the system component is factory interface.

* * * * *